United States Patent [19]
Tan et al.

[11] Patent Number: 5,652,081
[45] Date of Patent: Jul. 29, 1997

[54] POSITIVE WORKING PHOTORESIST COMPOSITION

[75] Inventors: Shiro Tan; Shinji Sakaguchi; Yasumasa Kawabe, all of Shizuoka, Japan

[73] Assignee: Fuji Photo Film Co., Ltd., Kanagawa, Japan

[21] Appl. No.: 708,676

[22] Filed: Sep. 5, 1996

[30] Foreign Application Priority Data

Sep. 20, 1995 [JP] Japan ..................................... 7-241895

[51] Int. Cl.$^6$ ............................................ G03F 7/023
[52] U.S. Cl. .................... 430/192; 430/165; 430/191; 430/193; 528/149; 528/155
[58] Field of Search ................................ 430/165, 192, 430/193, 191; 528/149, 155

[56] References Cited

U.S. PATENT DOCUMENTS

| | | | |
|---|---|---|---|
| 4,564,575 | 1/1986 | Perreault et al. | 430/192 |
| 4,642,282 | 2/1987 | Stahlhofen | 430/192 |
| 4,906,549 | 3/1990 | Asaumi et al. | 430/193 |
| 5,001,040 | 3/1991 | Blakeney et al. | 430/165 |
| 5,019,479 | 5/1991 | Oka et al. | 430/165 |
| 5,087,548 | 2/1992 | Hosaka et al. | 430/192 |
| 5,110,706 | 5/1992 | Yumoto et al. | 430/192 |

*Primary Examiner*—John S. Chu
*Attorney, Agent, or Firm*—Sughrue, Mion, Zinn, Macpeak & Seas

[57] ABSTRACT

Provided is a positive working photoresist composition which comprises an alkali-soluble resin and a 1,2-quinonediazide compound, with the resin being a novolak resin obtained by the condensation reaction of monomers comprising specified phenol compounds with formaldehyde.

8 Claims, No Drawings

POSITIVE WORKING PHOTORESIST COMPOSITION

FIELD OF THE INVENTION

The present invention relates to a positive working photoresist composition which is responsive to radiation. More particularly, the invention concerns a positive working photoresist composition having high heat resistance, high resolving power and wide defocus latitude so that this composition is suitable for use in fine processing.

BACKGROUND OF THE INVENTION

The positive working photoresist composition of the present invention is coated in a thickness of 0.5–3 μm on a substrate, such as semiconductor wafer, glass, ceramics or metal, by a spin or roller coating method. The coating thus obtained is heated, dried, irradiated with UV or so on via an exposure mask to print thereon a circuit pattern or the like, and then developed to provide a positive image.

Further, this positive image is used as a mask in an etching operation, and thereby a pattern is formed on the substrate. The photoresist is typically applied to production of semiconductor devices, such as IC, and circuit substrates for liquid crystals, thermal heads and the like, and to other photofabrication processes.

BACKGROUND OF THE INVENTION

A generally used positive working photoresist composition comprises an alkali-soluble resin (e.g., novolak resin) and a naphthoquinonediazide compound as a photosensitive material.

Naphthoquinonediazide compounds used as photosensitive materials are unique in having a property that the compounds themselves function as dissolution inhibitor to lower the solubility of a novolak resin in alkali; but, when irradiated with light, they decompose to produce alkali-soluble substances, and thereby to rather promote dissolution of a novolak resin in alkali. Owing to such a great change produced in property by light, naphthoquinonediazide compounds are particularly useful as the photosensitive materials of positive working photoresist compositions.

Novolak resins used as binder, on the other hand, are soluble in an alkali aqueous solution without swelling therein, and provide images which can offer high resistance to plasma etching when used as mask upon etching. Therefore, they are useful in particular for the present purposes.

For instance, the combinations of novolak-type phenol resins with naphthoquinonediazido-substituted compounds are disclosed, e.g., in U.S. Pat. Nos. 3,666,473, 4,115,128 and 4,173,470, and the combinations of novolak resins prepared from cresol and formaldehyde with trihydroxybenzophenone-1,2-naphthoquinonediazide sulfonic acid esters are described as most typical compositions in L. F. Thompson, *Introduction to Microlithography*, No. 219, pp. 112–121, ACS publisher.

As for the positive working photopolymer composition of the type which comprises an alkali-soluble novolak resin and a 1,2-quinonediazide compound, JP-B-3-36420 (The term "JP-B" as used herein means an "examined Japanese patent publication") discloses the use of the novolak resins obtained by condensing monomers comprising m-cresol and xylenol with aldehydes. Therein, it is stated that high sensitivity, high residual film rate, high dry-etching resistance, excellent heat-resisting properties and excellent developability can be achieved by the use of those resins.

Further, JP-B-2-51499 discloses the use of the novolak resins obtained by condensing 30–90% of m-cresol, 5–40% of p-cresol and 5–70% of xylenol with aldehydes. It also states that such novolak resins can ensure high sensitivity, high residual film rate, high dry-etching resistance, excellent heat-resisting properties and excellent developability to the positive working photopolymer composition of the foregoing type.

In the meanwhile, processing of superfine patterns having a line width of no broader than 1 μm is needed in the manufacture of semiconductor substrates for VLSI and the like. In order to answer such a purpose, it is required for photoresist to have very high resolving power, wide defocus latitude, high heat resistance, highly precise reproducibility of pattern shape by which exact copying of the shape of an exposure mask is enabled, and high sensitivity from the viewpoint of high productivity. Under the present situation, however, conventional positive working photoresists as cited above cannot cope with those severe performance requirements.

SUMMARY OF THE INVENTION

Therefore, an object of the present invention is to provide a positive working photoresist composition which ensures wide defocus latitude, high sensitivity, high resolving power and a resist image having high heat resistance, particularly in the manufacture of semiconductor devices.

Much account has been taken of the aforementioned characteristics in our intensive studies; as a result, it has been found that the foregoing object can be attained by the combined use of a specified alkali-soluble novolak resin and a quinonediazide compound, thereby achieving the present invention.

More specifically, the object of the present invention is attained by a positive working photoresist composition comprising an alkali-soluble resin and a 1,2-quinonediazide compound, said alkali-soluble resin being a novolak resin obtained by the condensation reaction of monomers comprising a phenol compound represented by formula (I) and a phenol compound represented by formula (II) with formaldehyde:

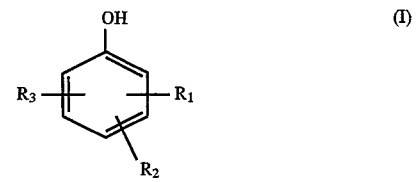

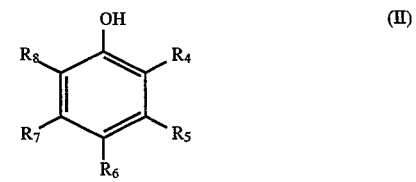

wherein $R_1$, $R_2$ and $R_3$ are the same or different, and each represents a hydrogen atom, a hydroxy group, a halogen atom, an alkyl group, a cylcoalkyl group, an alkoxy group, an alkenyl group, an aryl group, an aralkyl group, an alkoxycarbonyl group or an arylcarbonyl group; $R_4$ to $R_8$ are the same or different, and each represents a hydrogen atom, a hydroxy group, a halogen atom, an alkyl group, a cylcoalkyl group, an alkoxy group, an alkenyl group, an aryl group, an aralkyl group, an alkoxycarbonyl group, an arylcarbonyl group, —A—NHCO—$R_9$, —A—NHCOO—$R_9$, —A—NHCONH—$R_9$, —A—CONH—$R_9$ or —A—OCONH—$R_9$; A represents a single bond or an alkylene group; and $R_9$ represents a hydrogen atom, an alkyl group, an aryl group or an aralkyl group; provided that at least one of $R_4$ to $R_8$ is a group selected from among —A—NHCO—$R_9$, —A—NHCOO—$R_9$, —A—NHCONH—$R_9$, —A—CONH—$R_9$ and —A—OCONH—$R_9$.

In accordance with the present invention, a novolak resin obtained by the condensation reaction of monomers comprising phenol compounds represented by formulae (I) and (II) respectively with formaldehyde is used as alkali-soluble resin, and so the resultant positive working photoresist can have not only high resolving power and wide defocus latitude but also especially high heat resistance. Therefore, the positive working photoresist relating to the present invention is well suited to be used in a dry etching treatment which requires heat resisting property in particular.

DETAILED DESCRIPTION OF THE INVENTION

With respect to the substituents $R_1$ to $R_3$ in the foregoing formula (I), the halogen atom is preferably a chlorine atom, a bromine atom or an iodine atom, and more preferably a chlorine atom. As for the alkyl group, those containing 1 to 4 carbon atoms, such as methyl, ethyl, propyl, isopropyl, n-butyl, isobutyl, sec-butyl and t-butyl groups, are suitable examples thereof. Of these alkyl groups, a methyl group is preferred over the others from the viewpoint of sensitivity. Suitable examples of the cycloalkyl group for $R_1$ to $R_3$ include a cyclopropyl group, a cyclopentyl group, a cyclohexyl group, a cycloheptyl group and a cyclooctyl group. Of these groups, a cyclohexyl group is preferred over the others. Suitable examples of the alkoxy group for $R_1$ to $R_3$ include those containing 1 to 4 carbon atoms, such as methoxy, ethoxy, hydroxyethoxy, propoxy, hydroxypropoxy, isopropoxy, n-butoxy, isobutoxy, sec-butoxy and tert-butoxy groups. Of these groups, methoxy and ethoxy groups are preferred over the others. Suitable examples of the alkenyl group for $R_1$ to $R_3$ include those containing 2 to 4 carbon atoms, such as vinyl, propenyl, allyl and butenyl groups. Of these groups, vinyl and allyl groups are preferred over the others. Suitable examples of the aryl group for $R_1$ to $R_3$ include a phenyl group, a xylyl group, a toluyl group and a cumenyl group. Of these groups, a phenyl group is preferred over the others. As for the aralkyl group, a benzyl group, a phenetyl group and a cumyl group are preferable, and a benzyl group is more preferable. As for the alkoxycarbonyl group, a methoxycarbonyl group and an ethoxycarbonyl group are preferable, and a methoxycarbonyl group is more preferable. As for the arylcarbonyl group, a benzoyloxy group is preferred.

Additionally, the substituents $R_1$ to $R_3$ may be identical with or different from one another. Further, each substituent has no particular restriction as to the position at which it is attached to the benzene nucleus.

As for the phenols represented by the foregoing formula (I), specific examples thereof include phenol; cresols, such as o-cresol, m-cresol and p-cresol; xylenols, such as 2,5-xylenol, 3,5-xylenol, 3,4-xylenol, 2,3-xylenol, 2,4-xylenol and 2,6-xylenol; alkylphenols, such as o-ethylphenol, m-ethylphenol, p-ethylphenol and p-t-butylphenol, thymol and isothymol; alkoxyphenols, such as o-methoxyphenol, m-methoxyphenol, p-methoxyphenol, o-ethoxyphenol, m-ethoxyphenol, p-ethoxyphenol, 3,5-dimethoxyphenol, 2-methoxy-4-methylphenol, o-propoxyphenol, m-propoxyphenol, p-propoxyphenol, o-butoxyphenol, m-butoxyphenol and p-butoxyphenol; trimethylphenols, such as 2,3,5-trimethylphenol, 3,4,5-trimethylphenol and 2,3,6-trimethylphenol; alkenylphenols, such as o-vinylphenol, m-vinylphenol, p-vinylphenol, o-allylphenol, m-allylphenol and p-allylphenol; arylphenols, such as o-phenylphenol, m-phenylphenol and p-phenylphenol; aralkylphenols, such as o-benzylphenol, m-benzylphenol and p-benzylphenol; alkoxycarbonylphenols, such as o-methoxycarbonylphenol, m-methoxycarbonylphenol and p-methoxycarbonylphenol; arylcarbonylphenols, such as o-benzoyloxyphenol, m-benzoyloxyphenol and p-benzoyloxyphenol; halogenated phenols, such as o-chlorophenol, m-chlorophenol and p-chlorophenol; and polyhydroxybenzenes, such as catechol, resorcinol, hydroquinone, phloroglucinol and pyrogallol. However, it should be understood that those examples are not to be construed as limiting the scope of the invention.

In addition to those phenols, hydroxymethylated phenols, such as bishydroxymethyl-p-cresol, can also be used.

Of those phenols, phenol, cresols, xylenols and trimethylphenols are preferably used. In particular, m-cresol, p-cresol, o-cresol, 2,5-xylenol, 3,5-xylenol, 3,4-xylenol, 2,3-xylenol, 2,6-xylenol and 2,3,5-trimethylphenol are favored over the others.

Also, the phenol compounds of formula (I) can be used as a mixture of two or more thereof.

With respect to the substituents $R_4$ to $R_8$ in the foregoing formula (II), the halogen atom is preferably a chlorine atom, a bromine atom or an iodine atom, and more preferably a chlorine atom. As for the alkyl group, those containing 1 to 4 carbon atoms, such as methyl, ethyl, propyl, n-butyl, isobutyl, sec-butyl and t-butyl groups, are suitable examples thereof. Of these alkyl groups, a methyl group is preferred over the others from the viewpoint of sensitivity. Suitable examples of the cycloalkyl group for $R_4$ to $R_8$ include a cyclopropyl group, a cyclopentyl group, a cyclohexyl group, a cycloheptyl group and cyclooctyl group. Of these groups, a cyclohexyl group is preferred over the others. Suitable examples of the alkoxy group for $R_4$ to $R_8$ include those containing 1 to 4 carbon atoms, such as methoxy, ethoxy, hydroxyethoxy, propoxy, hydroxypropoxy, isopropoxy, n-butoxy, isobutoxy, sec-butoxy and tert-butoxy groups. Of these groups, methoxy and ethoxy groups are preferred over the others. Suitable examples of the alkenyl group for $R_4$ to $R_8$ include those containing 2 to 4 carbon atoms, such as vinyl, propenyl, allyl and butenyl groups. Of these groups, vinyl and allyl groups are preferred over the others. Suitable examples of the aryl group for $R_4$ to $R_8$ include a phenyl group, a xylyl group, a toluyl group and a cumenyl group. Of these groups, a phenyl group is preferred over the others. As for the aralkyl group, a benzyl group, a phenetyl group and a cumyl group are preferable, and a benzyl group is more preferable. As for the alkoxycarbonyl group, a methoxycarbonyl group and an ethoxycarbonyl group are preferable, and a methoxycarbonyl group is more preferable. As for the arylcarbonyl group, a benzoyloxy group is preferred.

Further, any of the substituents $R_4$ to $R_8$ can be —A—NHCO—$R_9$, —A—NHCOO—$R_9$, —A—NHCONH—$R_9$, —A—CONH—$R_9$ or —A—OCONH—$R_9$.

In formula (II) illustrated hereinbefore, however, it is required that at least one of the substituents $R_4$ to $R_8$ be selected from the group consisting of —A—NHCO—R$_9$, —A—NHCOO—R$_9$, —A—NHCONH—R$_9$, —A—CONH—R$_9$ and —A—OCONH—R$_9$. The phenol compound of formula (II) has no limitation on the number of substituents selected from the aforesaid group. However, it is desirable for the number of such substituents to be 3 or less, preferably 2, and particularly preferably 1. In addition, there is no restriction as to the position at which such a substituent is attached to the benzene nucleus. The substituent may be situated at any of the o-, m- and p-positions to —OH. As A, a single bond and an alkylene group having from 1 to 10 carbon atoms are preferred, and more preferably a single bond and an alkylene group having from 1 to 6 carbon atoms, particularly preferably a single bond and an alkylene group having 1 to 2 carbon atoms.

Additionally, R$_9$ is a hydrogen atom, an alkyl group, an aryl group or an aralkyl group, and each of these groups has the same examples as recited in the description of the substituents R$_4$ to R$_8$.

Specific examples of the phenol compound represented by formula (II) are illustrated below, but compounds usable in the present invention should not be construed as being limited to these examples.

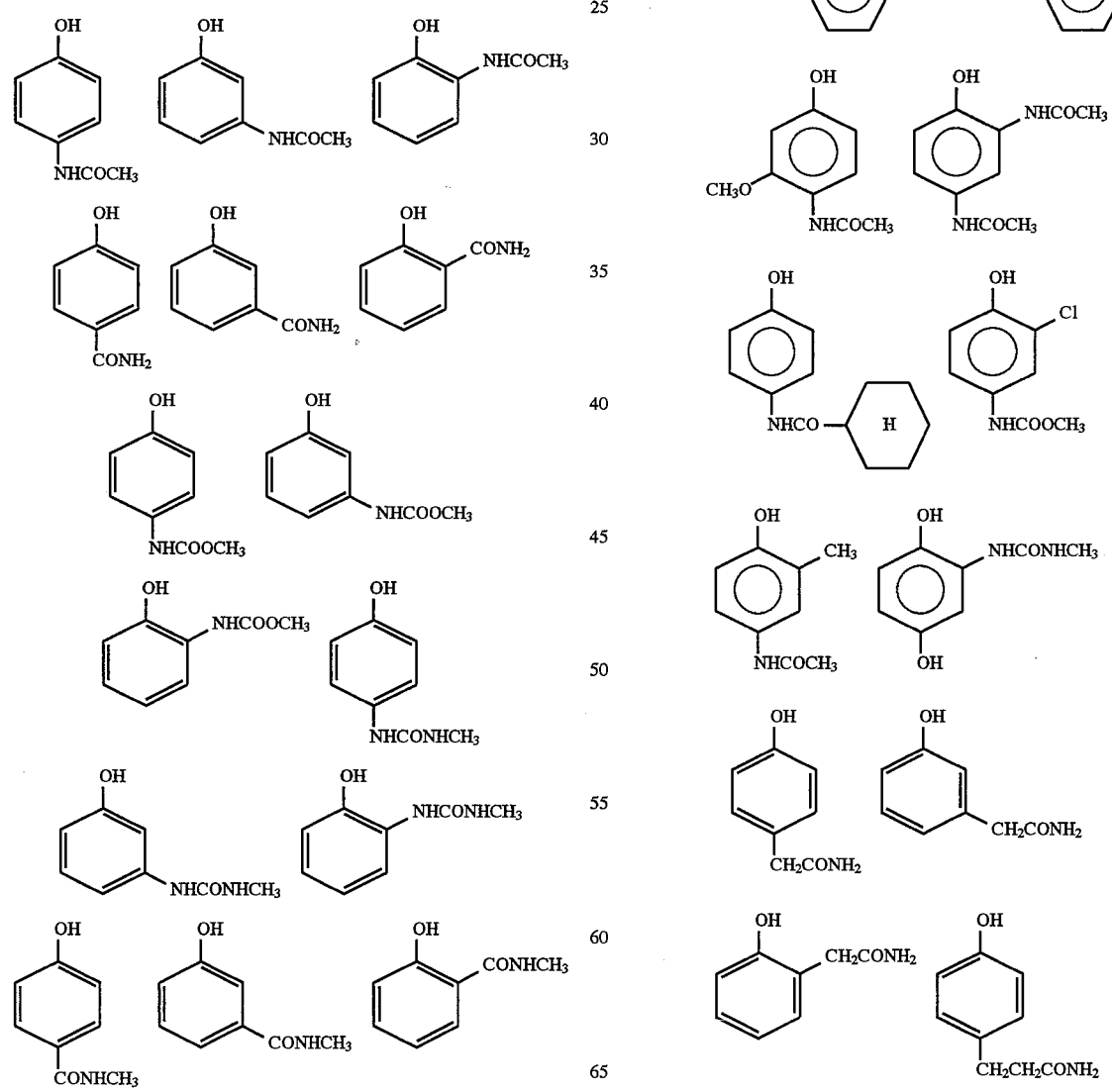

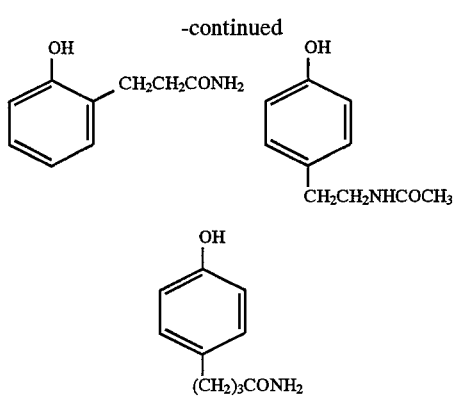

Further, the phenol compounds of formulae (I) and (II) can be used in combination with other phenol compounds. Examples of phenol compounds suitable for the combined use with the present phenol compounds include the polyhydric phenols, which each have 2 to 5 aromatic rings, described, e.g., in JP-A-5-181270, JP-A-5-323604, JP-A-5-249666, JP-A-5-232696, JP-A-60-164740, JP-A-5-323605, JP-A-4-226458, JP-A-5-188590 and JP-A-7-72623 (The term "JP-A" as used herein means an "unexamined published Japanese patent application). In the combined use, it is desirable that the proportion of such polyhydric phenols be not more than 30 mol %, preferably not more than 20 mol %, to the total of the phenol compounds of formulae (I) and (II).

The phenol compounds of formula (I) and the phenol compounds of formula (II) are mixed in a molar ratio of from 95:5 to 55:45, preferably from 95:5 to 70:30.

In the present invention, formaldehyde is comprised as an essential constituent, and may be used in the form of precursor, such as paraformaldehyde, trioxane or so on. Further, acetaldehyde, furfural, benzaldehyde, hydroxybenzaldehydes, crotonaldehyde, chloroacetaldehyde or the like can be used as the second aldehyde component.

It is desirable to use formaldehyde in a proportion of from 20 to 150 mol %, preferably from 50 to 120 mol %, to 100 mol % of total phenol compounds used, wherein the compounds of formulae (I) and (II) are comprised.

As for the acid catalyst used for the condensation reaction, hydrochloric acid, sulfuric acid, formic acid, acetic acid, p-toluenesulfonic acid and oxalic acid are examples thereof. Of these acids, oxalic acid and p-toluenesulfonic acid are preferred over the others. These acids can also be used in combination.

The weight-average molecular weight of the novolak resin of the present invention prepared from the aforementioned constituents is desirably from 3,000 to 20,000, more desirably from 4,000 to 18,000, and most desirably from 5,000 to 16,000. When the novolak resin of the present invention has a weight-average molecular weight less than 3,000, the resultant resist film comes to have a great thickness decrease in unexposed areas after development; while when the weight-average molecular weight thereof is greater than 20,000, the development speed becomes so slow to cause a lowering of the sensitivity. The novolak resin of the present invention can achieve most desirable effects when the resin obtained after removing a low molecular weight fraction from the reaction product has its weight-average molecular weight in the aforesaid range. In removing a low molecular weight fraction from the novolak resin, it is advantageous to adopt the arts described, e.g., in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147 and JP-A-4-122938, specifically including a method of fractional precipitation, a method of fractional dissolution, column chromatography and so on. This is because the adoption of such arts can improve upon resist performances, e.g., scumming, heat resistance and so on. As for the low molecular weight fraction, the percentage of its removal is desirably from 20 to 70, preferably from 30 to 60, by weight.

Herein, the term "weight-average molecular weight" is defined as the value calculated in polystyrene equivalent, which is determined by gel permeation chromatography (GPC).

The dispersion degree of a novolak resin (the ratio of the weight-average molecular weight Mw to the number-average molecular weight Mn, or Mw/Mn) is from 1.5 to 4.0, preferably from 1.8 to 3.5, and more preferably from 2.0 to 3.3. When the dispersion degree is greater than 4.0, performances of the resultant resist, such as the sensitivity, heat resistance and profile, are deteriorated. When the dispersion degree is smaller than 1.5, on the other hand, the synthesis of such novolak resins requires a high level of purification step, and so it is unsuitable from a practical point of view.

Other alkali-soluble resins which can be used together with the alkali-soluble novolak resin of the present invention have no particular restriction as far as they are compatible with novolak resins. However, polyhydroxystyrenes, acetone-pyrogallol resins, acetone-resorcin resins and the like are preferable because they cause no drop in heat resistance.

As for the photosensitive material, 1,2-quinonediazide compounds, preferably 1,2-naphtoquinonediazidesulfonyl esters are used in the present invention, and they can be obtained by the esterification reaction of polyhydroxy compounds as cited below with 1,2-naphthoquinonediazide-5- (and/or -4-)sulfonyl chloride in the presence of a basic catalyst.

As examples of polyhydroxy compounds which can be used in the foregoing esterification, mention may be made of polyhydroxybenzophenones, such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone; polyhydroxyphenylalkyl ketones, such as 2,3,4-trihydroxyacetophenone, 2,3,4-trihydroxyphenylpentyl ketone and 2,3,4-trihydroxyphenylhexyl ketone; bis((poly)hydroxyphenyl) alkanes, such as bis(2,4-dihydroxyphenyl)methane, bis(2,3, 4-trihydroxyphenyl)methane, bis(2,4-dihydroxyphenyl) propane-1, bis(2,3,4-trihydroxyphenyl)propane- 1 and nordihydroguaiaretic acid; polyhydroxybenzoic acid esters, such as propyl 3,4,5-trihydroxybenzoate, phenyl 2,3,4-trihydroxybenzoate and phenyl 3,4,5-trihydroxybenzoate; bis(polyhydroxybenzoyl)alkanes or bis (polyhydroxybenzoyl)arenes, such as bis(2,3,4-trihydroxybenzoyl)methane, bis(3-acetyl-4,5,6-trihydroxyphenyl)methane, bis(2,3,4-trihydroxybenzoyl) benzene and bis(2,4,6-trihydroxybenzoyl)benzene; alkylene-di(polyhydroxybenzoate)'s, such as ethylene glycol di(3,5-dihydroxybenzoate) and ethylene glycol di(3,4,5-trihydroxybenzoate); polyhydroxybiphenyls, such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2', 4',6'-biphenylhexol and 2,3,4,2',3',4'-biphenylhexol; bis (polyhydroxy)sulfides, such as 4,4'-thiobis(1,3-dihydroxy) benzene; bis(polyhydroxyphenyl) ethers, such as 2,2',4,4'-tetrahydroxydiphenyl ether; bis(polyhydroxyphenyl) sulfoxides, such as 2,2',4,4'-tetrahydroxydiphenyl sulfoxide; bis(polyhydroxyphenyl)sulfones, such as 2,2',4,4'-diphenylsulfone; polyhydroxytriphenylmethanes, such as tris(4-hydroxyphenyl)methane, 4,4',4''-trihydroxy-3,5,3',5'-tetramethyltriphenylmethane, 4,4',3'',4''-tetrahydroxy-3,5,3', 5'-tetramethyltriphenylmethane, 4,4',2'',3'',4''-pentahydroxy-3,5,3',5'-tetramethyltriphenylmethane, 2,3,4, 2',3',4'-hexahydroxy-5,5'-diacetyltriphenylmethane, 2,3,4,2', 3',4',3'',4''-octahydroxy-5,5'-diacetyltriphenylmethane and 2,4,6,2',4',6'-hexahydroxy-5,5'-dipropionyltriphenylmethane; polyhydroxyspirobi-indanes, such as 3,3,3',3'-tetramethyl-1,1'-spirobi-indane-5,6,5',6'-tetrol, 3,3,3',3'-tetramethyl-1,1'-spirobi-indane-5,6,7,5',6',7'-hexol, 3,3,3',3'-tetramethyl-1,1'-spirobi-indane-4,5,6,4',5',6'-hexol and 3,3,3',3'-tetramethyl-1,1'-spirobi-indane-4,5,6,5', 6',7'-hexol; polyhydroxyphthalides, such as 3,3-bis(3,4-dihydroxyphenyl)phthalide, 3,3-bis(2,3,4-trihydroxyphenyl)phthalide and 3',4',5',6'-tetrahydroxyspiro [phthalide-3,9'-xanthene]; flavonoid such as morin, quercetin and rutin; the polyhydroxy compounds described in JP-A-4-253058, such as α,α',α''-tris(4-hydroxyphenyl) 1,3,5-triisopropylbenzene, α,α',α''-tris(3,5-dimethyl-4-hydroxyphenyl) 1,3,5-triisopropylbenzene, α,α',α''-tris(3,5-diethyl-4-hydroxyphenyl) 1,3,5-triisopropylbenzene, α,α', α''-tris(3,5-di-n-propyl-4-hydroxyphenyl) 1,3,5-triisopropylbenzene, α,α',α''-tris(3,5-diisopropyl-4-hydroxyphenyl) 1,3,5-triisopropylbenzene, α,α',α''-tris(3,5-di-n-butyl-4-hydroxyphenyl) 1,3,5-triisopropylbenzene, α,α',α''-tris(3-methyl-4-hydroxyphenyl) 1,3,5-triisopropylbenzene, α,α',α''-tris(3-methoxy-4-hydroxyphenyl) 1,3,5-triisopropylbenzene, α,α',α''-tris(2,4-dihydroxyphenyl) 1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4''-hydroxyphenyl)ethyl] benzene, 1-[α-methyl-α-(4'-hydroxyphenyl)ethyl]-3-[α,α'-bis(4''-hydroxyphenyl)ethyl]benzene, 1-[α-methyl-α-(3',5'-dimethyl-4'-hydroxyphenyl)ethyl]-4-[α,α'-bis(3'',5''-dimethyl-4''-hydroxyphenyl)ethyl]benzene, 1-[α-methyl-α-(3'-methyl-4'-hydroxyphenyl)ethyl]-4-[α',α'-bis(3''-methyl-4''-hydroxyphenyl)ethyl]benzene, 1-[α-methyl-α-(3'-methoxy-4'-hydroxyphenyl)ethyl]-4-[α',α'-bis(3''-methoxy-4''-hydroxyphenyl)ethyl]benzene, 1-[α-methyl-α-(2',4'-dihydroxyphenyl)ethyl]-4-[α',α'-bis(4''-hydroxyphenyl) ethyl]benzene and 1-[α-methyl-α-(2',4'-dihydroxyphenyl) ethyl]-3-[α,α'-bis(4''-hydroxyphenyl)ethyl]benzene; and other polyhydroxy compounds, such as p-bis(2,3,4-trihydroxybenzoyl)benzene, p-bis(2,4,6-trihydroxybenzoyl) benzene, m-bis(2,3,4-trihydroxybenzoyl)benzene, m-bis(2, 4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl) benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis(2'-hydroxy-3'-t-butyl-5'-methylbenzyl)-p-cresol, 2,6-bis(2',3', 4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethylphenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)-1,3,4-trihydroxyphenol, 4,6-bis(2',4',6'-trihydroxybenzyl)-2,4-dimethylphenol and 4,6-bis(2',3',4'-trihydroxybenzyl)-2,5-dimethylphenol.

Also, phenol resins, such as novolak resins, of the type which contain small number of nuclei can be used.

Further, the polyhydroxy compounds as illustrated below can be used, too:

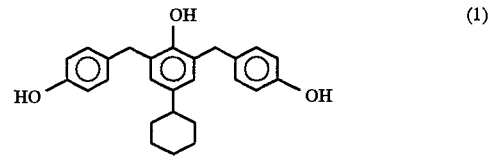

(1)

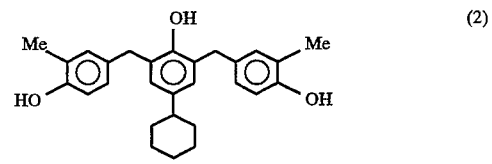

(2)

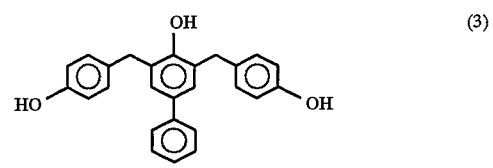

(3)

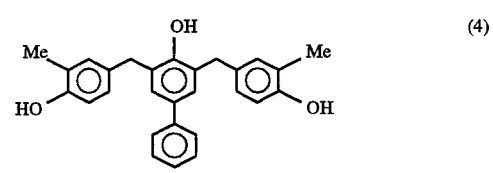

(4)

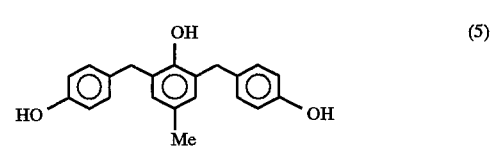

(5)

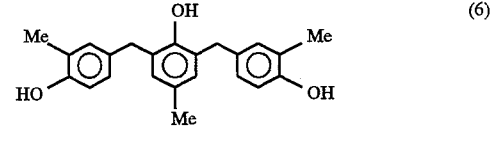

(6)

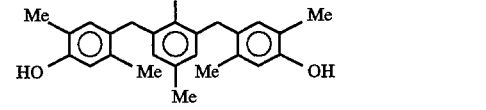

(7)

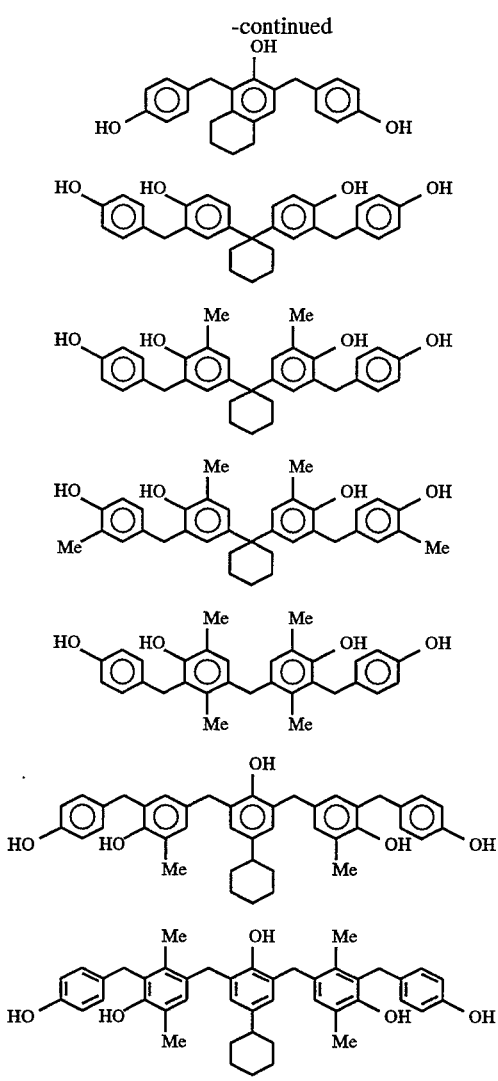

The esterification reaction for obtaining the photosensitive material described hereinbefore is achieved by dissolving prescribed amounts of polyhydroxy compound and 1,2-naphthoquinonediazide-5-(and/or -4-)sulfonyl chloride in a solvent, such as dioxane, acetone, tetrahydrofuran, methyl ethyl ketone, N-methylpyrrolidone, chloroform, trichloroethane, trichloroethylene or dichloroethane, and conducting condensation therein by adding dropwise thereto a basic catalyst, such as sodium hydroxide, sodium carbonate, sodium hydrogen carbonate, triethylamine, N-methylmorpholine, N-methylpiperazine or 4-dimethylaminopyridine. The thus obtained product is washed with water, purified, and then dried.

In a general esterification reaction, the product obtained is a mixture of esterified compounds differing in esterification number and esterified site. However, it is also possible to selectively esterify some particular isomer alone by choosing the reaction condition and the structure of a polyhydroxy compound to be esterified. The term "esterification rate" as used in the present invention refers to the average of esterification rates of the aforesaid mixture.

The esterification rate as defined above can be controlled by properly choosing the ratio between starting materials to be mixed, namely a polyhydroxy compound and 1,2-naphthoquinonediazide-5-(and/or -4-)sulfonyl chloride. More specifically, since substantially all the 1,2-naphthoquinonediazide-5-(and/or -4-)sulfonyl chloride added undergoes the esterification reaction, a mixture having a desired esterification rate can be obtained by adjusting the molar ratio between the starting materials.

1,2-Naphthoquinonediazide-5-sulfonyl chloride and 1,2-naphthoquinonediazide-4-sulfonyl chloride may be used together, if desired.

The reaction temperature in the foregoing method is generally from −20° C. to 60° C., and preferably from 0° to 40° C.

In the photoresist composition of the present invention, the photosensitive compound prepared in the manner as described above may be used as a single compound or a mixture of two or more compounds, and mixed with an alkali-soluble resin. The amount of the photosensitive compound to be mixed is from 5 to 150 parts by weight, preferably from 20 to 100 parts by weight, per 100 parts by weight of alkali-soluble resin. When the amount used is less than 5 parts by weight, the remaining rate of resist film is considerably low; while it is increased beyond 150 parts by weight, the sensitivity and the solubility in a solvent are lowered.

In the photoresist composition of the present invention, a polyhydroxy compound can further be used for the purpose of promoting the dissolution in a developer. Suitable examples of such a polyhydroxy compound include phenols, resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucidol, 2,4,2',4'-biphenyltetrol, 4,4'-thiobis(1, 3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris (hydroxyphenyl)butane and para[α,α,α',α'-tetrakis(4-hydroxyphenyl)]xylene.

These polyhydroxy compounds can be mixed in a proportion of generally no greater than 100 parts by weight, preferably from 5 to 70 parts by weight, to 100 parts by weight of quinonediazide compound.

Examples of a solvent which can be used for dissolving the photosensitive material and alkali-soluble novolak resin of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, and propylene glycol monomethyl ether propionate. These organic solvents are used alone or as a mixture of two or more thereof.

Also, such an organic solvent as cited above can be used in combination with a high boiling point solvent, such as N-methylformamide, N,N-dimethylformamide, N-methylacetamide, N,N-dimethylacetamide, N-methylpyrrolidone, dimethyl sulfoxide and benzyl ethyl ether.

Into the positive working photoresist composition of the present invention, a surfactant can be blended in order to improve upon coating properties, such as striation.

As examples of a surfactant which can be used for the aforesaid purpose, mention may be made of nonionic surfactants including polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylenesorbitan fatty acid esters, such as polyoxyethylenesorbitan monolaurate, polyoxyethylenesorbitan monopalmitate, polyoxyethylenesorbitan monostearate, polyoxyethylenesorbitan trioleate and polyoxyethylenesorbitan tristearate; fluorine-containing surfactants, such as Eftop EF 301, EF303 and EF352 (trade names, products of Shin Akita Kasei Co., Ltd.), Megafac F171 and F173 (trade names, products of Dainippon Ink & Chemicals, Inc.), Florad FC430 and FC431 (trade names, products of Sumitomo 3M), and Asahi Guard AG710, Surflon S-382, SC101, SC102, SC103, SC104, SC105 and SC106 (trade names, products of Asahi Glass Company Ltd.); organosiloxane polymers, such as KP341 (code name, a product of Shin-Etsu Chemical Industry Co., Ltd.): and acrylic acid or methacrylic acid (co)polymers, such as Polyflow No. 75 and No. 95 (trade name, products of Kyoeisha Yushi Kagaku Kogyo K.K.). Such a surfactant as cited above is generally blended in a proportion of no greater than 2 parts by weight, preferably no greater than 1 part by weight, to 100 parts by weight of the total of alkali-soluble resin(s) and quinonediazide compound(s) in the present composition.

Those surfactants may be added alone or as a mixture of some of them.

Developing solutions which can be used for the positive working photoresist composition of the present invention are aqueous solutions of alkalis, including inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide and choline, and cyclic amines such as pyrrole and piperidine. Also, the aqueous solutions of those alkalis can be admixed with appropriate amounts of an alcohol, such as isopropyl alcohol, and a surfactant of, e.g., nonionic type.

In the positive working photoresist composition of the present invention, a light absorbent, a cross-linking agent, an adhesion assistant and so on can be blended, if needed. The light absorbent is added for the purpose of inhibiting halation from a substrate or enhancing visibility when the photoresist composition is coated on a transparent support, if needed. Suitable examples of such a light absorbent include commercially available ones as described, e.g., in Kogyo-yo Shikiso no Gijutsu to Shijo (which means "Arts and Market of Industrial Dyes") published by CMC Shuppan and Senryo Binran (which means "Handbook of Dyes) compiled by Yuki Gosei Kagaku Kyokai, such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 165, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10, and C.I. Pigment Brown 2. The light absorbent as cited above is generally blended in a proportion of no greater than 100 parts by weight, preferably no greater than 50 parts by weight, and more preferably no greater than 30 parts by weight, to 100 parts by weight of alkali-soluble resin(s).

So far as it has no significant influence for the formation of positive images, a cross-linking agent is added. The addition of a cross-linking agent is intended mainly for adjustment of sensitivity and improvements in heat resistance and dry etching resistance.

As examples of a cross-linking agent which can be used, mention may be made of compounds obtained by acting formaldehyde on melamine, benzoguanamine, glycoluril and the like, alkyl-modified compounds thereof, epoxy compounds, aldehydes, azide compounds, organic peroxides, and hexamethylenetetramine. These cross-linking agents can be blended in a proportion of less than 10 parts by weight, preferably less than 5 parts by weight, to 100 parts by weight of a light-sensitive agent. When the amount of a cross-linking agent blended is increased beyond 10 parts by weight, undesirable things including a drop in sensitivity and generation of scum (resist residue) are caused.

An adhesion assistant is added for the purpose of heightening the adhesiveness of the resist to a substrate, thereby preventing the resist from peeling off, particularly in an etching step. Specific examples thereof include chlorosilanes, such as trimethylchlorosilane, dimethylvinylchlorosilane, methyldiphenylchlorosilane and chloromethyldimethylchlorosilane; alkoxysilanes, such as trimethylmethoxysilane, dimethyldiethoxysilane, methyldimethoxysilane, dimethylvinylethoxysilane, diphenyldimethoxysilane and phenyltriethoxysilane; silazanes, such as hexamethyldisilazane, N,N'-bis(trimethylsilyl)urea, dimethyltrimethylsilylamine and trimethylsilylimidazole; silanes, such as vinyltrichlorosilane, γ-chloropropyltrimethoxysilane, γ-aminopropyltriethoxysilane and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and urea compounds, such as 1,1-dimethylurea and 1,3-dimethylurea, or thiourea compounds.

These adhesion assistants are blended in a proportion of generally less than 10 parts by weight, preferably less than 5 parts by weight, to 100 parts by weight of alkali-soluble resin(s).

The positive working photoresist composition as mentioned above is coated on a substrate suitable for production of precision integrated circuit elements (e.g., a transparent substrate such as silicon/silicon dioxide-coated glass substrate and ITO substrate) by an appropriate coating means, such as a spinner or coater. The thus coated composition is subjected successively to prebake, exposure to light via a desired mask, PEB (PEB: Post Exposure Bake) if needed, development, rinsing and drying to provide satisfactory resist. The photoresist composition of the present invention can also applied to a PS plate.

The present invention will now be illustrated in more detail by reference to the following Examples which are not to be considered as limiting on the scope of the invention. Additionally, all "%" are by weight unless otherwise noted.

EXAMPLES 1 TO 12 AND COMPARATIVE EXAMPLE 1

Synthesis of Novolak Resin (1) Synthesis of Novolak Resin (a-1):

In a 1 l three-necked flask equipped with a stirrer, a reflux condenser and a thermometer, 129.77 g of m-cresol, 9.73 g of p-cresol, 172.26 g of 2,3-xylenol, 45.35 g of m-acetamidophenol, 218.55 g of an aqueous solution or formaldehyde (37.10%) and 100 g of ethyl 3-ethoxypropionate were placed and stirred at 90° C. Thereto was added 11.35 g of oxalic acid dihydrate. After a 30-minute lapse, the bath temperature was raised to 130° C., and the contents was further stirred for 14.5 hours under reflux. After replacing the reflux condenser by a Liebig condenser, the bath temperature was raised up to 200° C. over a period of about 1 hour, and thereby the formaldehyde remaining unreacted, water and so on were removed.

Further, the distillation under ordinary pressure was continued for 1 hour, and then the pressure was gradually reduced to 1 mmHg to remove unreacted monomers. It took 2 hours to distill away the unreacted monomers under reduced pressure.

The molten alkali-soluble novolak resin was recovered by cooling to room temperature. The novolak resin thus obtained had a weight-average molecular weight of 5250 (reduced to a polystyrene basis).

A 100 g portion of this novolak resin was dissolved in 1,000 g of acetone, and thereto was added 1,000 g of n-hexane with stirring. Further, the stirring was continued for 30 minutes at room temperature. Then, the resulting solution was allowed to stand for 1 hour. The upper layer was removed by decantation, and the solvent was distilled away from the residual lower layer by means of a rotary evaporator. Thus, a solid novolak resin (a-1) was obtained. The weight-average molecular weight of the novolak resin (a-1) was 7230 (reduced to a polystyrene basis) and the dispersion degree thereof was 2.5.

(2) Syntheses of Novolak Resins (a-2) to (a-8):

The intended amounts of monomers and formaldehyde were charged as set forth in Table 1, and subjected to polymerization and subsequent fractionation in the same manner as in Synthesis (1), thereby obtaining novolak resins (a-2) to (a-8) respectively.

(In Table 1, the amounts of monomers charged in each synthesis are expressed in terms of the ratio by mol. In each synthesis, the total amount of the charged monomers was adjusted to 3.0 mols. On the other hand, the amount of formaldehyde charged in each synthesis is expressed in mol %, or the proportion by mol to the total amount (i.e., 3.0 mols) of monomers charged.)

(3) Synthesis of Novolak Resin (a-9):

In a 1 l three-necked flask equipped with a stirrer, a reflux condenser and a thermometer, 14.27 g of 2,2'-dihydroxy-5, 5'-dimethyldiphenylmethane, 5.41 g of o-cresol, 167.98 g of 2,3-xylenol, 68.10 g of 2,3,5-trimethylphenol, 24.43 g of 2,6-xylenol, 37.79 g of m-acetamidophenol, 191.21 g of an aqueous solution of formaldehyde (37.3%) and 50 g of ethyl 3-ethoxypropionate were placed. The resultant mixture was heated at 90° C. with stirring, and thereto 9.46 g of oxalic acid dihydrate was added.

After a 30-minute lapse, the bath temperature was raised to 130° C., and the contents was refluxed for additional 11.5 hours with stirring. Thereto, 25 g of ethyl 3-ethoxypropionate was added again, and the reaction mixture was further refluxed for 6 hours. Further, the resultant solution was admixed with 25 g of ethyl 3-ethoxypropionate. Thereafter, the reflux condenser was replaced by a Liebig condenser, and the bath temperature was raised up to 200° C. over a period of about 1 hour to remove the formaldehyde remaining unreacted, water and so on. It took 3 hours to distill away the unreacted formaldehyde, water and so on. The heating was ceased, and thereby the temperature inside the flask was lowered to 180° C. Thereupon, 620 g of ethyl lactate was added little by little to the reaction product, thereby obtaining the ethyl lactate solution of a novolak resin (a-9). The novolak resin (a-9) thus obtained had a weight-average molecular weight of 6600 (reduced to a polystyrene basis), and the dispersion degree thereof was 3.37.

(4) Synthesis of Novolak Resin (a-10):

Synthesis was conducted in the same manner as (3) above, except that 37.79 g of p-hydroxyphenyl acetamide was used instead of 37.79 g of m-acetamidophenol and the amount of an aqueous solution of formaldehyde was changed to 215.87 g. The novolak resin (a-10) thus obtained had a weight-average molecular weight of 4410 (reduced to a polystyrene basis), and the dispersion degree thereof was 2.73.

TABLE 1

Syntheses of Novolak Resins

| Novolak Resin | Monomers Charged | | Amount of Formaldehyde (mol %) | Molecular weight | | Dispersion Degree |
|---|---|---|---|---|---|---|
| | species*) | Ratio (by mol) | | before fractionation | after fractionation | |
| a-1 | m/p/2,3Xy/m-AAP | 40/3/47/10 | 90 | 5250 | 7230 | 2.5 |
| a-2 | m/p/2,3Xy/m-AAP | 40/3/37/20 | 90 | 6100 | 8610 | 2.8 |
| a-3 | m/2,3Xy/m-AAP | 50/40/10 | 90 | 5530 | 7820 | 2.7 |
| a-4 | m/p/3,5Xy/m-AAP | 50/3/37/10 | 80 | 3210 | 4410 | 2.2 |
| a-5 | m/p/2,3,5TMP/m-AAP | 50/3/37/10 | 85 | 3310 | 4720 | 2.2 |
| a-6 | m/p/2,3Xy/p-AAP | 40/3/47/10 | 90 | 4630 | 6980 | 2.5 |
| a-7 | m/p/2,3Xy/o-HBA | 40/3/47/10 | 90 | 4660 | 6720 | 2.5 |
| a-8 | m/p/2,3Xy/p-HBA | 40/3/47/10 | 90 | 4250 | 6440 | 2.4 |
| b-1 | m/p/2,3Xy | 50/3/47 | 90 | 4870 | 7170 | 2.5 |

*)m: m-cresol, p: p-cresol, 2,3Xy: 2,3-xylenol, 3,5Xy: 3,5-xylenol, 2,3,5TMP: 2,3,5-trimethylphenol, m-AAP: m-acetamidophenol, p-AAP: p-acetamidophenol, o-HBA: o-hydroxybenzamide, p-HBA: p-hydroxybenzamide

(4) Syntheses of Novolak Resins (b-1):

The intended amounts of monomers and formaldehyde were charged as set forth in Table 1, and subjected to polymerization and subsequent fractionation in the same manner as in Synthesis (1), thereby obtaining a novolak resins (b-1).

(In Table 1, the amounts of monomers charged in the synthesis are expressed in terms of the ratio by mol. In the synthesis, the total amount of the charged monomers was adjusted to 1.5 mols. On the other hand, the amount of formaldehyde charged in the synthesis is expressed in mol %, or the proportion by mol to the total amount (i.e., 1.5 mols) of monomers charged.)

Synthesis of Photosensitive Material

(5) Synthesis of Photosensitive Material (S-1):

In a three-necked flask, 62.9 g of Compound (1) illustrated in Table 2, 53.7 g of 1,2-naphthoquinonediazide-5-sulfonyl chloride and 800 ml of acetone were placed, and mixed homogeneously to make a solution. Then, 21.2 g of triethylamine was slowly dripped into the solution, and therein the reaction was run for 3 hours at 25° C. The reaction mixture thus obtained was poured into 3 l of a 1% aqueous solution of hydrogen chloride to precipitate the intended product. The precipitated product was filtered off, washed with water and dried. Thus, a photosensitive material (S-1) was obtained.

(6) Synthesis of Photosensitive Material (S-2):

In a three-necked flask, 53.8 g of Compound (2) illustrated in Table 2, 53.7 g of 1,2-naphthoquinonediazide-5-sulfonyl chloride and 800 ml of acetone were placed, and mixed homogeneously to make a solution. Then, 21.2 g of triethylamine was slowly dripped into the solution, and therein the reaction was run for 3 hours at 25° C. The reaction mixture thus obtained was poured into 3 l of a 1% aqueous solution of hydrogen chloride to precipitate the intended product. The precipitated product was filtered off, washed with water and dried. Thus, a photosensitive material (S-2) was obtained.

(7) Synthesis of Photosensitive Material (S-3):

In a three-necked flask, 56.5 g of Compound (3) illustrated in Table 2, 53.7 g of 1,2-naphthoquinonediazide-5-sulfonyl chloride and 800 ml of acetone were placed, and mixed homogeneously to make a solution. Then, 21.2 g of triethylamine was slowly dripped into the solution, and therein the reaction was run for 3 hours at 25° C. The reaction mixture thus obtained was poured into 3 l of a 1% aqueous solution of hydrogen chloride to precipitate the intended product. The precipitated product was filtered off, washed with water and dried. Thus, a photosensitive material (S-3) was obtained.

TABLE 2

Compound for Mother Nucleus of Photosensitive Material (1) [chemical structure]

TABLE 2-continued

Compound for Mother Nucleus of Photosensitive Material (2) [chemical structure]

(3) [chemical structure]

Preparation and Evaluation of Positive Working Photoresist Compositions

Each of photoresist compositions (Examples 1 to 12 and Comparative Example 1) was prepared by mixing one novolak resin selected from the novolak resins (a-1) to (a-10) and (b-1) obtained in the aforementioned Syntheses (1) to (4), the photosensitive material (S-1), (S-2) or (S-3) obtained in the aforementioned Synthesis (5), (6) or (7) respectively, one or two solvents selected from Solvents (Y-1) to (Y-4) and one polyhydroxy compound (P-1), (P-2) or (P-3) illustrated below in Table 3 in their respective proportions as set forth in Table 4, making the resultant mixture into a homogeneous solution, and then passing the solution through a microfilter having a pore size of 0.10 μm. Each photoresist composition thus prepared was coated on a silicon wafer by means of a spinner, and dried at 90° C. for 60 seconds with a vacuum contact hot plate, thereby forming a resist film having a thickness of 1.02 μm.

Additionally, Solvents (Y-1), (Y-2), (Y-3) and (Y-4) represent ethyl cellosolve acetate, ethyl hydroxypropionate, ethyl methoxypropionate and ethyl ethoxypropionate, respectively.

TABLE 3

Polyhydroxy Compound

P-1 [chemical structure]

TABLE 3-continued

Polyhydroxy Compound

P-2

[Structure: 1,1-bis(4-hydroxyphenyl)cyclohexane]

P-3

[Structure: tris(hydroxymethylphenyl)methane derivative with OH groups and Me substituents]

TABLE 5

Evaluation Results

| | Relative Sensitivity | Resolving Power (μm) | Defocus Latitude (μm) | Heat Resistance (°C.) |
|---|---|---|---|---|
| Example 1 | 1.4 | 0.28 | 1.7 | 145 |
| Example 2 | 1.3 | 0.29 | 1.8 | 145 |
| Example 3 | 1.2 | 0.30 | 1.9 | 145 |
| Example 4 | 1.3 | 0.28 | 1.7 | 140 |
| Example 5 | 1.2 | 0.28 | 1.8 | 145 |
| Example 6 | 1.2 | 0.29 | 1.7 | 145 |
| Example 7 | 1.3 | 0.28 | 1.6 | 145 |
| Example 8 | 1.4 | 0.30 | 1.8 | 140 |
| Example 9 | 1.4 | 0.30 | 1.9 | 140 |
| Example 10 | 1.4 | 0.28 | 1.7 | 140 |
| Example 11 | 1.3 | 0.28 | 1.8 | 145 |
| Example 12 | 1.3 | 0.30 | 1.8 | 140 |
| Comparative Example 1 | 1.0 | 0.38 | 1 | 135 |

TABLE 4

| | Novolak Resin | | Photosensitive Material | | Polyhydroxy Compound | | Solvent | |
|---|---|---|---|---|---|---|---|---|
| | Species | Amount added* | Species | Amount added* | Species | Amount added* | Species | Amount added* |
| Example 1 | a-1 | 100 | S-1 | 70 | P-1 | 40 | Y-2/Y-4 | 530/135 |
| Example 2 | a-2 | 100 | S-3 | 95 | P-2 | 50 | Y-1 | 600 |
| Example 3 | a-3 | 100 | S-2 | 60 | P-3 | 30 | Y-1 | 665 |
| Example 4 | a-4 | 100 | S-3 | 70 | P-3 | 40 | Y-2/Y-4 | 530/135 |
| Example 5 | a-5 | 100 | S-1 | 80 | P-2 | 40 | Y-2/Y-4 | 530/135 |
| Example 6 | a-6 | 100 | S-2 | 60 | P-1 | 35 | Y-3 | 700 |
| Example 7 | a-7 | 100 | S-1 | 70 | P-1 | 45 | Y-1 | 620 |
| Example 8 | a-8 | 100 | S-3 | 80 | P-2 | 35 | Y-2/Y-4 | 545/135 |
| Example 9 | a-9 | 100 | S-1 | 60 | P-3 | 30 | Y-3 | 680 |
| Example 10 | a-1 | 100 | S-3 | 70 | P-1 | 40 | Y-3 | 775 |
| Example 11 | a-3 | 100 | S-2 | 70 | P-2 | 40 | Y-1 | 190 |
| Example 12 | a-10 | 100 | S-1 | 65 | P-2 | 25 | Y-2/Y-4 | 560/140 |
| Comparative Example 1 | b-1 | 100 | S-1 | 70 | P-1 | 40 | Y-2/Y-4 | 530/135 |

*: parts by weight

Each resist film was exposed to light by means of a reducing projection exposure apparatus (Model NSR-005i9C, made by Nikon), underwent PEB (Post Exposure Baking) at 110° C. for 60 seconds, developed for 1 minute with a 2.38% of aqueous solution of tetramethylammonium hydroxide, washed with water for 30 seconds, and then dried.

Each resist pattern thus obtained on the silicon wafer was observed under a scanning electron microscope, and thereby the resist performance was evaluated. The evaluation results are shown in Table 5.

In the evaluation, the sensitivity is defined as the reciprocal of the exposure amount required for reproducing a 0.40 μm mask pattern, and shown as relative value, with the resist of Comparative Example 1 being taken as 1.0.

The resolving power was expressed as the limiting resolving power under the exposure for reproducing a 0.40 μm mask pattern.

In evaluating a defocus latitude, the focus range in which a 0.40 μm resist pattern was resolved without a decrease in film thickness under the effective speed was examined by profile observation under a scanning electron microscope.

The heat resistance was represented by the temperature at which the edge part of a 0.50 μm line pattern began to round.

The positive working photoresist compositions obtained in accordance with the present invention, as mentioned above, not only have high resolving power and wide defocus latitude but also provide resist images having excellent heat resistance, and so they are well suitable for the fine processing in the production of semiconductor devices and so on.

While the invention has been described in detail and with reference to specific embodiments thereof, it will be apparent to one skilled in the art that various changes and modifications can be made therein without departing from the spirit and scope thereof.

What is claimed is:

1. A positive working photoresist composition comprising an alkali-soluble resin and a 1,2-quinonediazide compound, said alkali-soluble resin being a novolak resin obtained by the condensation reaction of monomers comprising a phenol compound represented by formula (I) and a phenol compound represented by formula (II) with formaldehyde:

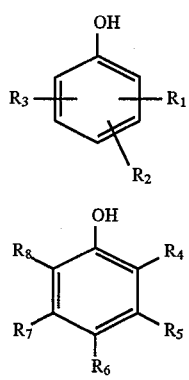

(I)

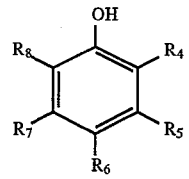

(II)

wherein $R_1$, $R_2$ and $R_3$ are the same or different, and each represents a hydrogen atom, a hydroxy group, a halogen atom, an alkyl group, a cycloalkyl group, an alkoxy group, an alkenyl group, an aryl group, an aralkyl group, an alkoxycarbonyl group or an arylcarbonyl group; $R_4$ to $R_8$ are the same or different, and each represents a hydrogen atom, a hydroxy group, a halogen atom, an alkyl group, a cyloalkyl group, an alkoxy group, an alkenyl group, an aryl group, an aralkyl group, an alkoxycarbonyl group, an arylcarbonyl group, —A—NHCO—$R_9$, —A—NHCOO—$R_9$, —A—NHCONH—$R_9$, —A—CONH—$R_9$ or —A—OCONH—$R_9$; A represents a single bond or an alkylene group; and $R_9$ represents a hydrogen atom, an alkyl group, an aryl group or an aralkyl group; provided that at least one of $R_4$ to $R_8$ is a group selected from among —A—NHCO—$R_9$, —A—NHCOO—$R_9$, —A—NHCONH—$R_9$, —A—CONH—$R_9$ and —A—OCONH—$R_9$.

2. The positive working photoresist composition as claimed in claim 1, further comprising a polyhydric phenol compound other than the phenol compounds of formulae (I) and (II).

3. The positive working photoresist composition as claimed in claim 1, wherein the mixing ratio of the phenol compound of formula (I) to the phenol compound of formula (II) is from 95:5 to 55:45.

4. The positive working photoresist composition as claimed in claim 1, wherein the mixing ratio of the phenol compound of formula (I) to the phenol compound of formula (II) is from 95:5 to 70:30.

5. The positive working photoresist composition as claimed in claim 1, wherein the proportion of said formaldehyde is from 20 to 150 mol %, to 100 mol % of total phenol compounds comprising the compounds of formulae (I) and (II) in the composition.

6. The positive working photoresist composition as claimed in claim 1, wherein the proportion of said formaldehyde is from 50 to 120 mol %, to 100 mol % of total phenol compounds comprising the compounds of formulae (I) and (II) in the composition.

7. The positive working photoresist composition as claimed in claim 1, wherein the novolak resin has a weight-average molecular weight of from 3,000 to 20,000.

8. The positive working photoresist composition as claimed in claim 1, wherein the novolak resin has a weight-average molecular weight of from 4,000 to 18,000.

* * * * *